United States Patent

Jiang et al.

Patent Number: 5,939,773
Date of Patent: Aug. 17, 1999

[54] SEMICONDUCTOR LASER PACKAGE INCLUDING A LEAD FRAME AND PLASTIC RESIN HOUSING

[75] Inventors: Wenbin Jiang, Phoenix; Michael S. Lebby, Apache Junction; Craig A. Gaw, Scottsdale, all of Ariz.

[73] Assignee: Motorola, Inc., Schaumburg, Ill.

[21] Appl. No.: 08/692,355

[22] Filed: Aug. 5, 1996

[51] Int. Cl.⁶ .......................... H01L 23/495; H01L 23/02; H01L 23/28
[52] U.S. Cl. .......................... 257/666; 257/680; 257/787
[58] Field of Search .......................... 257/666, 680, 257/787

[56] References Cited

U.S. PATENT DOCUMENTS 5,516,727  5/1996  Broom .
5,732,101  3/1998  Shin .
5,801,402  9/1998  Shin .
5,812,582  9/1998  Gilliland et al. .
5,818,404  10/1998  Lebby et al. .
5,821,571  10/1998  Lebby et al. .

*Primary Examiner*—David E. Graybill
*Attorney, Agent, or Firm*—Eugene A. parsons; William E. Koch

[57] ABSTRACT

A semiconductor laser package including a laser chip mounted to a leadframe, and a plastic resin housing for encapsulating the laser chip. The laser chip composed of a vertical cavity surface emitting laser and a photodetector. The vertical cavity surface emitting laser generating an emission along a path. The leadframe being positioned a fixed distance from an emission window formed in the plastic resin housing. The laser chip mounted in precise z-axis alignment from the emission window utilizing the leadframe as a dimensional reference point, with the bump height compensating for variations in laser chip dimension. An optical element is optionally positioned in the path to reflect a portion of the emission.

22 Claims, 2 Drawing Sheets

SEMICONDUCTOR LASER PACKAGE INCLUDING A LEAD FRAME AND PLASTIC RESIN HOUSING

FIELD OF THE INVENTION

The present invention pertains to semiconductor lasers and more specifically to the packaging of semiconductor lasers.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSELs) in place of edge emitting lasers. The VCSELs provide a much lower cost, use surface emissions which simplify optical devices and are capable of being fabricated in larger volumes on semiconductor wafers. However, a problem exist in the packaging of such VCSELs, namely the cost of materials employed in the typical "can" type packages and the steps that must be taken for achieving proper alignment, more particularly z-axis alignment, of the laser chip within the package due to variations in the thickness of the actual chip, the semiconductor wafer, or the like.

The conventional semiconductor laser apparatus utilizes a metal TO can for packaging, and includes the formation of a "window" within a cap portion of the can through which the laser emission passes. The laser chip is positioned within the can based on measurements specific for that chip. This positioning allows for variation of the chip thickness, etc., yet is not time or cost effective. In addition, in the typical metal can a "window" must be formed to allow for the passage of the emission. An external lens will be placed in the light path away from the window for either beam collimating or focusing. Due to poor die placement accuracy by machine, which is typically ±80 $\mu$m, manual z-axis alignment will be needed to control the relative distance between the lens and the laser emission aperture. This procedure not only increases the system packaging cost, but also limits the manufacturing throughput.

In monitoring the power of these devices, generally, edge emitting laser diodes employ a power monitoring detector facing the back emission facet of the device. In a VCSEL with a wavelength shorter than 870 nm, there is no back emission due to the opaque substrate on which the device is necessarily formed.

Therefore, there exist a need for improved packaging of vertical cavity surface emitting lasers, more specifically a package that would allow for controlled alignment of the laser chip emission aperture relative to an integrated optical element, such as an emission window equivalent to the TO can glass window, or an integrated collimating or focusing lens, so as to reduce the cost of manufacture and the complexity of system assembly. In addition, there is a need to incorporate into the package a monitoring system which will automatically control the emissions emitted by the VCSEL.

Thus there is a need for a lower cost semiconductor laser package that has included therein a means for aligning the laser chip so as to allow proper z-axis alignment of the laser emission aperture relative to the emission window or the integrated lens, a power monitoring system, thus allowing for automatic power control (APC) of the VCSEL emission, utilizes low cost materials, and is simple to fabricate.

Accordingly, it is highly desirable and an object of this invention to provide for a low cost semiconductor laser package that incorporates proper z-axis alignment of the laser chip emission aperture relative to the integrated optics, such as the emission window or the lens.

It is another purpose of the present invention to provide for a new and improved semiconductor laser package that is inexpensive and easily fabricated.

It is yet another purpose of the present invention to provide for a new and improved semiconductor laser package that allows for automatic power control of the VCSEL emission.

SUMMARY OF THE INVENTION

The above problems and others are substantially solved and the above purposes and others are realized in a semiconductor laser package including a laser chip, composed of a vertical cavity surface emitting laser generating an emission along a path including a power monitoring system. The laser chip can be formed as a VCSEL with a separate laterally positioned photodetector, a vertically integrated photodetector, a laterally integrated photodetector, a dual VCSEL with flip chip photodetector, or the like. In a preferred embodiment the laser chip is direct chip attached (DCA), utilizing mounting bumps, to an underneath surface of a leadframe. The uppermost surface of the leadframe is utilized as a reference point for the positioning of the top emission surface of the VCSEL, thus the laser emission aperture, determined by the thickness of the leadframe and the bump height. A molded plastic resin housing is utilized for encompassing the vertical cavity surface emitting laser and the monitoring system, having an emission window formed therein an uppermost surface through which the laser emission passes. The uppermost surface of the leadframe serves as a reference point during fabrication of the plastic resin housing, and more specifically the dimensional reference point from the uppermost surface of the leadframe to the emission window.

There is further optionally incorporated an optical element, such as a volume hologram, a refractive optical element, a slanted optical surface, or the like, positioned in alignment with the emission window of the plastic resin package and in the path of the laser emission, thereby capable of correcting, or reflecting a portion of the emission. The monitoring system, such as a photodetector, is optically positioned, formed integral with the vertical cavity surface emitting laser or as a separate device, to receive a portion of the laser emission.

The overall package design, more specifically the plastic resin housing, is formed as an overmolded housing, one molded component or as separate components, partially or completely encapsulating the laser chip and photodetector. When molding the plastic in one piece, there may be included within the package an underfill material having a coefficient of thermal expansion (CTE) equivalent to the vertical cavity surface emitting laser, thereby protecting the vertical cavity surface emitting laser from degradation due to mechanical stress caused by different coefficients of thermal expansion.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
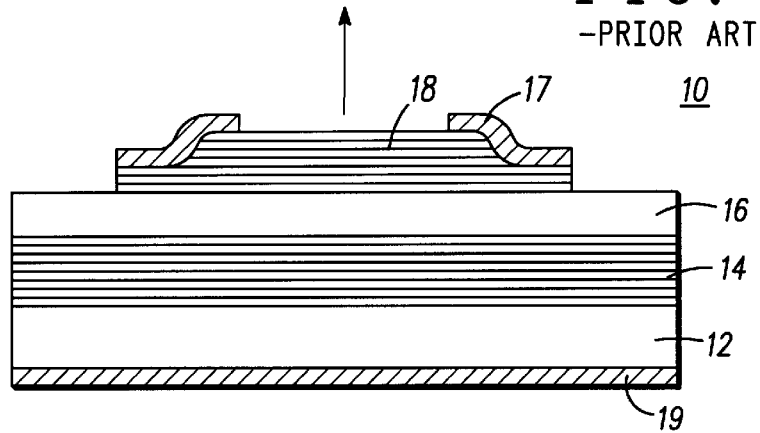
FIG. 1 is a simplified cross-sectional view of a typical ridge VCSEL.

Turning now to the drawings in which like reference characters indicate corresponding elements throughout the several views, discussion is first directed to the formation of a laser chip, composed of a vertical cavity surface emitting laser (VCSEL) and power monitor, namely a photodetector. More specifically, included is the formation of a ridge VCSEL having formed as a part thereof a vertically integrated PIN photodetector, a vertically integrated MSM photodetector, a laterally integrated photodetector, a separate laterally positioned photodetector, a dual VCSEL and flip chip photodetector, or the like. It should be understood throughout the description that the specific VCSEL/photodetector chips illustrated in the varying embodiments, are being utilized for purposes of this disclosure only and can utilize any of a wide variety of different types of VCSELs including ridge, planar, those etched through to the structure, etc.

Referring now to FIG. 1, illustrated is a cross-sectional view of a typical ridge VCSEL. A brief description is given as to the formation of a ridge VCSEL, more specifically the epitaxially growth of a plurality of layers which is similar for the four above-described embodiments of the formation of a VCSEL and photodetector. Briefly, the ridge VCSEL 10 of FIG. 1 is schematically representative of the typical VCSEL formation of the present invention. More specifically, VCSEL 10 is fabricated on any suitable semiconductor substrate 12, such as gallium arsenide, indium phosphide, or the like where semiconductor substrate 12 provides a surface. A first stack of distributed Bragg reflectors 14, an active region 16, and a second stack of distributed Bragg reflectors 18 are epitaxially deposited on the surface by any suitable method, such as molecular beam epitaxy (MBE), metoorganic chemical vapor deposition (MOCVD), or the like. First stack of distributed Bragg reflectors 14 includes a plurality of layers of semiconductor material with alternating indexes of refraction. Active region 16 is grown on the upper surface of first stack of distributed Bragg reflectors 14, which includes one or more quantum wells separated by barrier layers with a spacer and/or cladding layer on either side thereof. The quantum wells and spacer layers are also grown epitaxially. Second stack of distributed Bragg reflectors 18 is formed on the upper surface of active region 16 by, for example, epitaxially growing pairs of semiconductor layers as described in conjunction with first stack 14. First and second stacks 14 and 18 are doped with opposite conductivity types to form a two terminal (diode) structure for the flow of electrical current therethrough. There is provided a first electrical contact 17 positioned on the upper surface of the second stack of distributed Bragg reflectors 18 and a second electrical contact 19 positioned over the lower surface of substrate 12. With the epitaxial depositions being complete, the second stack of distributed Bragg reflectors 18 is patterned to form a ridge. Generally, ridge VCSEL 10 is made by any suitable well known method in the art, such as photolithography, etching, lift-off, any combination thereof, or the like. By defining a ridge in the second stack of distributed Bragg reflectors 18, an optical path is defined in the second stack of distributed Bragg reflectors 18 that reflects and guides light formed in active region 16. A complete disclosure of the construction of ridge VCSELs is available in U.S. Pat. No. 5,256,596 entitled "TOP EMITTING VCSEL WITH IMPLANT", issued Oct. 26, 1993, assigned to the same assignee and incorporated herein by this reference.

Once the epitaxial depositions are complete, and the ridge VCSEL 10 has been formed a series of depositions and patterning steps are performed to fabricate an integrally formed photodetector. Alternatively, and as previously stated, the photodetector can be fabricated as a separate device, laterally positioned from VCSEL 10 on substrate 12 or on a separate substrate, or a second VCSEL can be formed in series with VCSEL 10, having a photodetector flip chip mounted thereupon, so as to monitor laser emissions from the second VCSEL, similar to those of VCSEL 10. Generally during fabrication of the laser chip, composed of VCSEL 10 and the photodetector (not shown), the depositions are performed by any suitable well-known method in the art such as chemical vapor deposition (CVD), plasma enhanced chemical vapor deposition (PECVD), sputtering, or the like. In addition, the patterning steps also are performed by any suitable well-known methods or processes in the art, such as photolithography, lift-off, etching, or combination thereof. Further information and more detailed descriptions regarding the fabrication of specific embodiments of the laser chip utilized in the laser package of the present invention can be found in the following U.S. patent applications: (i) U.S. patent application, Ser. No. 08/672,731, Attorney docket CR96-116, entitled "VCSEL WITH INTEGRATED PIN DIODE", mailed on Jun. 25, 1996, assigned to the same assignee and incorporated herein by this reference, (ii) U.S. patent application, Ser. No. 08/675,307, Attorney docket CR 96-055, entitled "VCSEL WITH INTEGRATED MSM DIODE", mailed on Jun. 25, 1996, assigned to the same assignee and incorporated herein by this reference, (iii) U.S. patent application, Ser. No. 08/673,488, Attorney docket CR 96-036, entitled "VERTICAL CAVITY SURFACE EMITTING LASER WITH LATERALLY INTEGRATED PHOTODETECTOR", mailed on Jun. 28, 1996, assigned to the same assignee and incorporated herein by this reference, (iv) U.S. patent application entitled "REFLECTION POWER MONITORING SYSTEM FOR VERTICAL CAVITY SURFACE EMITTING LASERS", Ser. No. 08/639,462, filed on Apr. 29, 1996, assigned to the same assignee and incorporated herein by this reference, and (v) U.S. patent application entitled "FLIP CHIP POWER MONITORING SYSTEM FOR VERTICAL CAVITY SURFACE EMITTING LASERS", Ser. No. 08/641,256, filed on Apr.

30, 1996, assigned to the same assignee and incorporated herein by this reference.

The disclosed embodiments of the laser chip, more specifically VCSEL 10 with a power monitor serve as the emitting device and the monitoring device in the laser package of the present invention, thus capable of automatic power control (APC) by monitoring the emissions from the VCSEL 10. As previously stated, the monitoring is accomplished by fabricating and/or positioning the photodetector to receive and monitor a portion of the emissions passing therethrough or reflected from an optical element designed as a part of the laser package (discussed presently).

Figure 2:
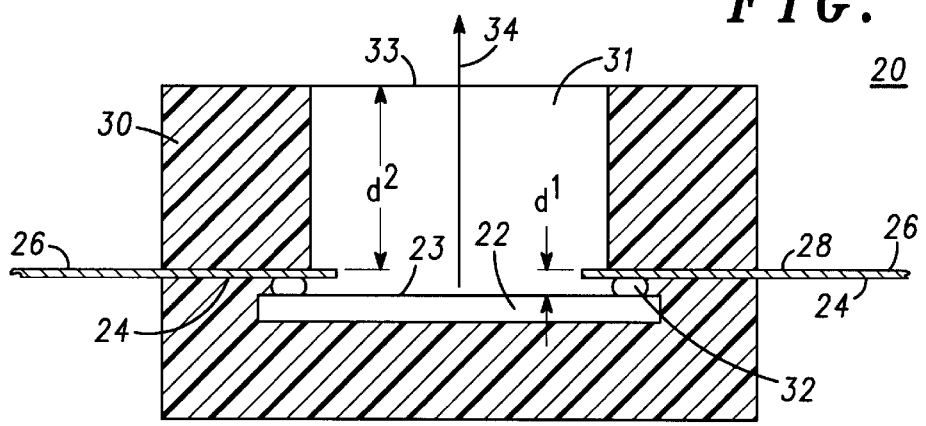
FIG. 2 is a simplified cross-sectional view of a one-piece molded semiconductor laser package completely encapsulating the laser chip and photodetector of the present invention.

Referring now to FIG. 2, illustrated is a first embodiment of the laser package of the present invention. Laser package 20 is fabricated utilizing a plastic resin overmolding type housing for encapsulation of a laser chip 22. It should be understood that laser chip 22 is generally composed of a VCSEL (similar to ridge VCSEL 10 previously described) and a power monitor (according to any of the previously described embodiments). During the fabrication of laser package 20, laser chip 22 is direct chip attached (DCA) utilizing a plurality of bonding pads/mounting bumps 32 to an underneath surface 24 of a leadframe 26. An uppermost surface 28 of leadframe 26 will serve as a fixed z-axis reference point of package 20, relative to an emission window (discussed presently). A plastic resin overmolded housing 30 defining package 20 is formed next. Uppermost surface 28 of leadframe 26 serves as the reference point for fabrication of an optically transparent emission window 33, generally fabricated as an uppermost planar surface in optical alignment with laser chip 22. It should be understood that the emission path from laser chip 22 is generally shown by the directional arrow 34. The distance, referenced here as "$d^1$" between an emission aperture 23, or emission surface, of the laser chip 22 and the uppermost surface 28 of leadframe 26 (the dimensional reference point) will be determined by the thickness of bonding pads/mounting bumps 32 and the thickness of leadframe 26. Bumps 32 are generally formed of gold, gold tin alloy, indium alloys, conductive epoxy, conductive polymer, or any other suitable conductive material, thereby physically and electrically interfacing laser chip 22 with leadframe 26. As stated, by varying the bump height, compensation can be made for variances in laser chip thicknesses while maintaining a specific distance from the emission aperture 23 of chip 22 to emission window 33. More specifically, compensation for variance is made in distance "$d^1$", the distance from the laser emission aperture 23 of laser chip 22 to the uppermost surface 28 of leadframe 26. The distance "$d^2$" between uppermost surface 28 of leadframe 26 and emission window 33 is a predetermined fixed distance, dependent upon the laser spatial mode characteristics and the laser beam divergence angle. Accordingly, by utilizing uppermost surface 28 of leadframe 26 as a dimensional reference point, precise z-axis alignment of laser chip 22 can be achieved when fabricating package 20.

Overmolded housing 30 defining laser package 20 is formed of an opaque plastic, or an opaque layering over a clear plastic, thereby preventing external background light from entering the monitoring photodetector. Emission window 33 and an area 31 directly between emission aperture 23 of laser chip 22 and the emission window 33 is formed of a substantially transparent plastic thereby permitting the passage therethrough of laser emission. Overmolded housing 30 is formed utilizing injection or transfer molding techniques, common in the art, with a coefficient of thermal expansion (CTE) in a range of 10–30 ppm, with a preferred CTE of 20 ppm or less. There is optionally provided an underfill material (not shown), generally formed from the same composition as the molding compound for package 20 for index matching purposes. Due to this one-piece type of molding of package 20, underfill material such as silicon gel, or any type of polymer that has similar thermal expansion coefficients as that of laser chip 22 can be used to reduce thermal stress by preventing the overmolding compound from direct contact with chip 22. It should be understood that the outside dimension of laser package 20 can be the same as the typical TO metal type package, currently known in the art, for purposes of compatibility.

Figure 3:
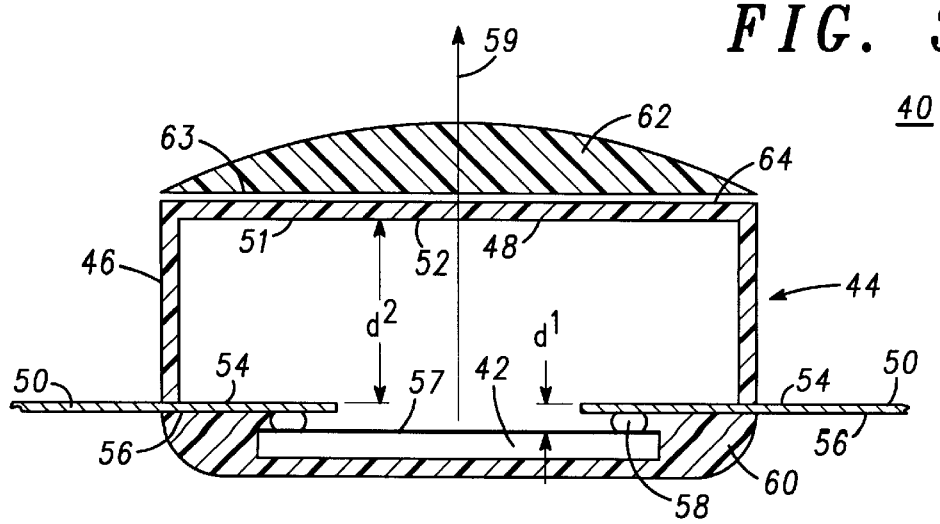
FIG. 3 is a simplified cross-sectional view of another embodiment of a molded semiconductor laser package partially encapsulating the laser chip and photodetector of the present invention and having an optical element positioned thereupon.

Referring now to FIG. 3, illustrated is a simplified cross-sectional view of a second embodiment of a laser package housing a laser chip, or more specifically a vertical cavity surface emitting laser with a photodetector, in accordance with the present invention. As illustrated, laser package 40 is formed generally similar to package 20, previously described. Laser package 40 is fabricated utilizing a plastic resin molded package allowing for positioning of a leadframe 50, thus a laser chip 42, relative to a molded housing 44, generally composed of a sidewall 46 and an uppermost planar surface 48 structure. There is optionally provided overmolding 60 on a lower aspect of package 40 for protection of laser chip 42. It should be understood that laser chip 42 is generally composed of a VCSEL (similar to ridge VCSEL 10 previously described) and a power monitor (according to any of the previously described embodiments). During the fabrication of laser package 40, leadframe 50 is molded into sidewall 46 of package 40, having an uppermost surface 54 of leadframe 50 positioned a distance "$d^2$" from an emission window 52 formed in uppermost planar surface 48 of package 40. Uppermost surface 54 of leadframe 50 will serve as a dimensional reference point from which the emission window 52 is formed a distance therefrom, and for the z-axis positioning of laser chip 42.

It should be understood that uppermost planar surface 48 is generally formed of a transparent plastic and therefore serves as emission window 52, or alternatively can be formed of an opaque plastic having a transparent window portion formed therein. Generally, sidewall 46 of package 40 is formed of an opaque plastic, thereby preventing external background light from entering the monitoring photodetector of laser chip 42. Laser chip 42 is direct chip attached (DCA) utilizing a plurality of bonding pads/mounting bumps 58 to an underneath surface 56 of leadframe 50. It should be understood that the emission path from laser chip 42 is generally shown by the directional arrow 59. The distance "$d^1$" between the top emission surface, or an emission aperture 57, of laser chip 42 and the uppermost surface 54 of leadframe 50 (the reference point) will be determined by the thickness of bonding pads/mounting bumps 58 and the thickness of the leadframe. The distance "$d^2$" between uppermost surface 54 of leadframe 50 and emission window 52 is a predetermined fixed distance, dependent upon the laser spatial mode characteristics and the laser beam divergence angle.

As stated, the molded housing 44 of laser package 40 is formed of an opaque plastic, thereby preventing external background light from entering the monitoring photodetector. Emission window 52 is formed of a substantially transparent plastic thereby permitting the passage therethrough of laser emission. Molded housing 44 is formed utilizing injection or transfer molding techniques, common in the art, with a coefficient of thermal expansion (CTE) in a range of 10–30 ppm, with a preferred CTE of 20 ppm or less. Optionally provided overmolding 60 is formed of a material similar to that of housing 44 of package 40 for index matching purposes. Overmolding material such as silicon gel, or any type of polymer that has similar thermal expansion coefficients as that of laser chip 42 can be used to reduce thermal stress, thereby protecting chip 42. It should be understood, as in the first embodiment, that the outside dimension of laser package 40 can be the same as the typical TO metal type package, currently known in the art, for compatibility.

Housing 44 of package 40 has positioned thereupon an optical element 62. In this embodiment, optical element 62 is generally a curved optical element, more specifically a plano-convex lens element, thereby shaping the laser emission from laser chip 42. Optical element 62 is formed having a generally planar lower aspect 63, thereby allowing for positioning of optical element 62 on planar surface 48 of package 40. Optical element 62 is positioned using any type of an optically transparent adhesive material 64 positioned between an uppermost surface of a planar surface 51 of package 40 and the planar lower aspect 63 of optical element 62. In the alternative, optical element 62 can be formed integral with housing 44 of package 40, more specifically molded into housing 44 at the time of fabrication.

Figure 4:
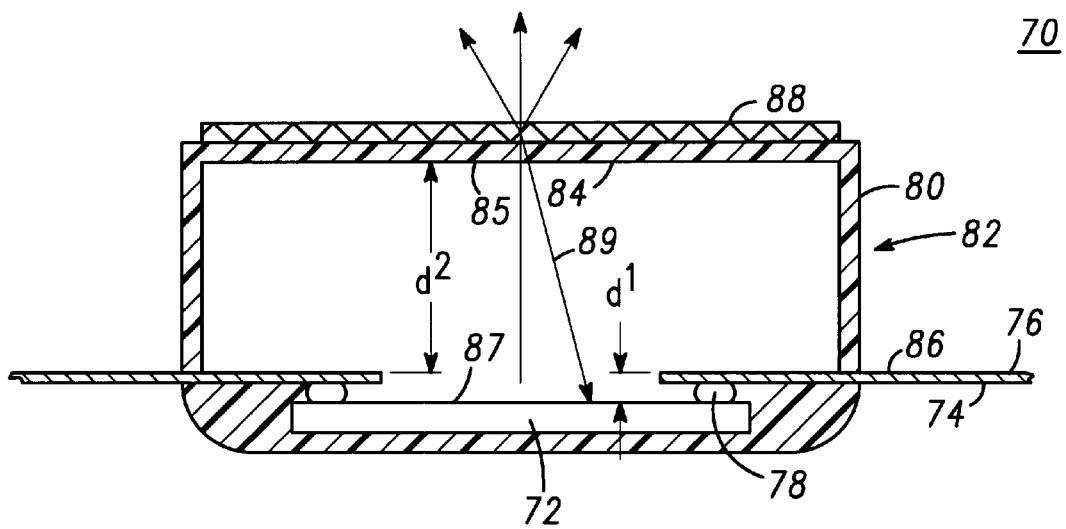
FIG. 4 is a simplified cross-sectional view of another embodiment of a molded semiconductor laser package partially encapsulating the laser chip and photodetector of the present invention and having a hologram optical element positioned thereupon.

Referring now to FIG. 4, illustrated is a simplified cross-sectional view of a laser package 70, generally similar in fabrication to laser package 40, previously described. In general, there is provided a laser chip 72, direct chip attached to an underneath surface 74 of a leadframe 76 utilizing a plurality of bonding pads/mounting bumps 78. Leadframe 76 is molded into a sidewall 80 of a housing 82 of package 70. An uppermost planar surface 84 is molded with or attached to sidewall 80, thereby providing an emission window 85 through which laser emissions from laser chip 72 pass. As in the previous embodiments, an uppermost surface 86 of leadframe 76 serves as a dimensional reference point for the fabrication of emission window 85. More specifically, emission window 85 is fabricated a fixed distance, referenced in FIG. 4 as "$d^2$", from uppermost surface 86 of leadframe 76 dependent upon laser spatial mode characteristics and the laser beam divergence angle. Laser chip 72 is direct chip attached (DCA) to underneath surface 74 of leadframe 76 utilizing a plurality of bonding pads/mounting bumps 78, or the like. Again, the uppermost surface 86 of leadframe 76 serves as the dimensional reference point from which the distance to the laser emission surface, or an emission aperture 87, referenced as distance "$d^1$", is measured. This ability to direct chip attach laser chip 72 to leadframe 76 allows for adjustment in bump heights during fabrication. Die thickness variation in this DCA mounting will not affect the z-axis alignment, thus no further compensation is needed.

In this embodiment, there is provided an optical element 88 which is a volume holographic optical element (HOE). HOEs are used to divide and shape emissions from VCSELs, more specifically laser emissions from laser chip 72. HOE 88 employs a transmission grating to divide the emission into three beams for three-beam-spot detection. A reflected diffraction beam 89 from the HOE 88 is received by the photodetector of laser chip 72 positioned adjacent the VCSEL.

It is disclosed to combine any of the above-described embodiments of the package of the present invention, more particularly the complete enclosure of the laser chip within a one-piece molded housing, or the attachment of the leadframe, thus the laser chip within a housing defined by sidewalls, wherein the laser chip is protected by a layer of overmolding on an opposed side of the laser chip, with a variety of optical element. Accordingly, it is further disclosed to form an optical elements, or mold the uppermost planar surface of the housing of the present invention, to provide for a transparent surface tilted at a degree of angle with respect to emissions from the laser chip. With an angle of 4 degrees or more, a certain percentage of the emission will be reflected back towards the laser chip for monitoring. It should be understood that depending on the refractive index of the molding compound, the amount of reflection will vary. In this embodiment, the photodetector of the laser chip is mounted adjacent the VCSEL to receive the reflected light, thus monitoring-the emissions.

Due to the low power operation of vertical cavity surface emitting lasers in general, thermal dissipation of such plastic packages disclosed in the previous embodiments should not be a problem. Although, as previously stated there is optionally provided transparent epoxy or an underfill type material, with a coefficient of thermal expansion (CTE) equivalent to the laser chip, thereby providing a buffer prior to the molding of the plastic housing about the device or as a protective covering for an exposed lower aspect of the laser chip as illustrated in FIGS. 3 and 4.

Figure 5:
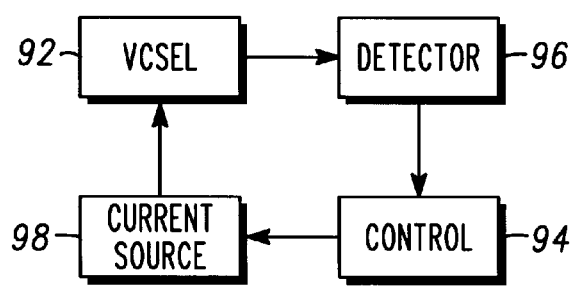
FIG. 5 is a block diagram of a power monitoring system including automatic power control device in accordance with the present invention.

Turning now to FIG. 5, illustrated is the operation of the monitoring system of the present invention, referenced as 90. In monitoring system 90 the laser power of a VCSEL 92 is controlled by employing a feedback system. A control device 94 receives and processes the information monitored by a photodetector 96. More specifically, the laser power output based upon the specific laser power detected by monitoring the reflected laser emission of VCSEL 92. This processing of the information monitored by photodetector 96 allows for the identification of a point at which a change in laser power is detected, thereby providing for automatic regulation of the current employed to drive VCSEL 92 from a current source 98. Thus, knowledge of the laser power at which the laser light is emitted, allows for automatic power control (APC) based on feedback, thereby maintaining operation of the laser at a specific, constant laser power output.

Thus, a semiconductor laser package with power monitoring system is disclosed. More specifically, provided is a package and method of fabrication that allows for precise z-axis positioning of a laser chip within a molded plastic resin housing. More specifically, there is provided housed within the package a vertical cavity surface emitting laser having provided as a separate device or formed integral therewith, a photodetector. An optical element formed separate or integral with the package is positioned within the emission path of the vertical cavity surface emitting laser, thereby serving to permit substantially 90% of the laser emission to pass therethrough when a vertically integrated photodetector is utilized, or permitting a substantial portion of the laser emission to pass therethrough while reflecting back a small percentage for monitoring by the photodetector when a laterally integrated or laterally positioned photodetector is utilized. The package allows for the positioning of the laser chip based relative to a distance from a reference point, here an uppermost surface of a leadframe. The leadframe is positioned a fixed distance from the emissions window of the housing. This fixed distance allows for adjustable positioning of the laser chip, dependent upon laser chip variations and specific dimensions, a distance from the emission window, thereby achieving proper and precise z-axis alignment of the laser chip within the laser package.

In describing the fabrication of the laser package of the present invention, various steps of the method disclosed have been performed in a specific order for purposes of explanation. However, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser package comprising:
   a laser chip, including a vertical cavity surface emitting laser generating an emission along a path and a power monitor optically positioned to receive a portion of the emission, the laser chip being mounted to an underneath surface of a leadframe; and
   a plastic resin housing, including an optically transparent emission window fabricated a distance from an uppermost surface of the leadframe and in optical alignment with the vertical cavity surface emitting laser, the emission generated by the vertical cavity surface emitting laser capable of passing therethrough.

2. A semiconductor laser package according to claim 1 wherein the distance between the optically transparent emission window and the uppermost surface of the leadframe is determined by spatial mode characteristics and a beam divergence angle of the vertical cavity surface emitting laser.

3. A semiconductor laser package according to claim 2 wherein the mounting of the laser chip to an underneath surface of the leadframe utilizes a plurality of mounting bumps.

4. A semiconductor laser package according to claim 3 wherein the plurality of mounting bumps are formed of one of gold, gold tin alloy, indium alloys, conductive epoxy and conductive polymer.

5. A semiconductor laser package according to claim 2 further including an optical element positioned in the path of the emission and reflecting a portion of the emission.

6. A semiconductor laser package according to claim 5 wherein the optical element is formed as a portion of the plastic resin housing.

7. A semiconductor laser package according to claim 5 wherein the optical element is formed having a surface tilted at a degree of angle with respect to the emission.

8. A semiconductor laser package according to claim 5 wherein the optical element is a holographic optical element having a transmission grating for splitting the emission.

9. A semiconductor laser package according to claim 5 wherein the optical element is a curved optical element.

10. A semiconductor laser package according to claim 9 wherein the curved optical element is a refractive optical element.

11. A semiconductor laser package as claimed in claim 2 further including an underfill material positioned about laser chip, whereby the underfill material and the laser chip have similar coefficients of thermal expansion.

12. A semiconductor laser package according to claim 2 wherein the power monitor is a photodetector.

13. A semiconductor laser package according to claim 12 wherein the photodetector is carried adjacent the vertical cavity surface emitting laser.

14. A semiconductor laser package according to claim 12 wherein the photodetector is vertically integrated with the vertical cavity surface emitting laser.

15. A semiconductor laser package according to claim 12 wherein the photodetector is laterally integrated with the vertical cavity surface emitting laser.

16. A semiconductor laser package comprising:
   a laser chip, including a vertical cavity surface emitting laser generating an emission along a path and a photodetector optically positioned to receive a portion of the emission, the laser chip being mounted to an underneath surface of a leadframe;
   a plastic resin housing, including an optically transparent emission window fabricated a fixed distance from an uppermost surface of the leadframe, determined by spatial mode characteristics and a beam divergence angle of the vertical cavity surface emitting laser and in optical alignment with the vertical cavity surface emitting laser, the emission generated by the vertical cavity surface emitting laser capable of passing therethrough; and
   an optical element positioned in the path and reflecting a portion of the emission.

17. A semiconductor laser package according to claim 16 wherein the plastic resin housing is formed as a one-piece overmolded structure.

18. A semiconductor laser package according to claim 16 wherein the optical element is formed as a portion of the plastic resin housing.

19. A semiconductor laser package according to claim 16 wherein the optical element has a surface tilted at a degree of angle with respect to the emission.

20. A semiconductor laser package according to claim 16 wherein the optical element is a holographic optical element having a transmission grating for splitting the emission.

21. A semiconductor laser package according to claim 16 wherein the optical element is a curved optical element.

22. A semiconductor laser package according to claim 16 wherein the photodetector is one of carried adjacent the vertical cavity surface emitting laser, vertically integrated with the vertical cavity surface emitting laser and laterally integrated with the vertical cavity surface emitting laser.

* * * * *